United States Patent
Man et al.

(10) Patent No.: US 9,245,713 B2
(45) Date of Patent: Jan. 26, 2016

(54) CHARGED PARTICLE BEAM APPARATUS

(71) Applicant: HITACHI HIGH-TECH SCIENCE CORPORATION, Minato-ku, Tokyo (JP)

(72) Inventors: Xin Man, Tokyo (JP); Tatsuya Asahata, Tokyo (JP); Atsushi Uemoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/470,135

(22) Filed: Aug. 27, 2014

(65) Prior Publication Data

US 2015/0060668 A1    Mar. 5, 2015

(30) Foreign Application Priority Data

Sep. 2, 2013    (JP) ................. 2013-181520

(51) Int. Cl.
    *G21K 5/04*    (2006.01)
    *H01J 37/317*    (2006.01)
    *H01J 37/244*    (2006.01)
    *H01J 37/28*    (2006.01)

(52) U.S. Cl.
CPC ............. *H01J 37/317* (2013.01); *H01J 37/244* (2013.01); *H01J 37/28* (2013.01); *H01J 2237/063* (2013.01); *H01J 2237/08* (2013.01); *H01J 2237/2802* (2013.01); *H01J 2237/31749* (2013.01)

(58) Field of Classification Search
USPC ................. 250/305, 306, 307, 309, 310, 311, 250/492.1, 492.2, 492.21, 492.22, 492.23, 250/492.3
See application file for complete search history.

(56) References Cited

U.S. PATENT DOCUMENTS

2005/0082478 A1*   4/2005   Tanaka et al. ............... 250/311
2013/0277552 A1*   10/2013   Nanri ................ H01J 37/304
                                                                     250/307

FOREIGN PATENT DOCUMENTS

JP          2009294235     12/2009
WO    WO 2012/090670   *  7/2012  ......... H01J 37/244

* cited by examiner

*Primary Examiner* — Niccole Ippolito
(74) *Attorney, Agent, or Firm* — Adams & Wilks

(57) ABSTRACT

A charged particle beam apparatus for processing a tip end portion of a sample into a needle shape, includes an ion beam irradiation unit that irradiates the tip end portion with ion beams, an electron beam irradiation unit that irradiates the tip end portion with electron beams, a secondary electron detection unit that detects secondary electrons generated at the tip end portion by the irradiation with the electron beams, and an EBSD detection unit that detects diffracted electrons generated at the tip end portion by the irradiation with the electron beams.

9 Claims, 6 Drawing Sheets

*FIG. 5A* *FIG. 5B*
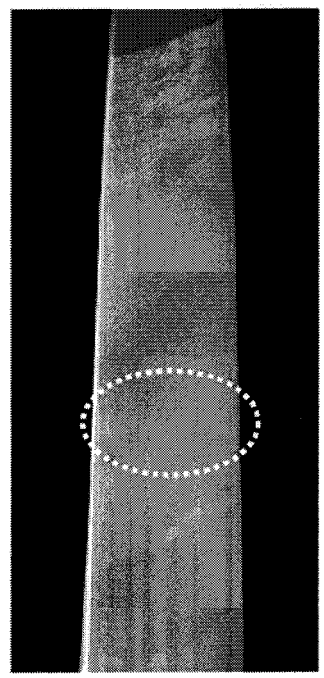 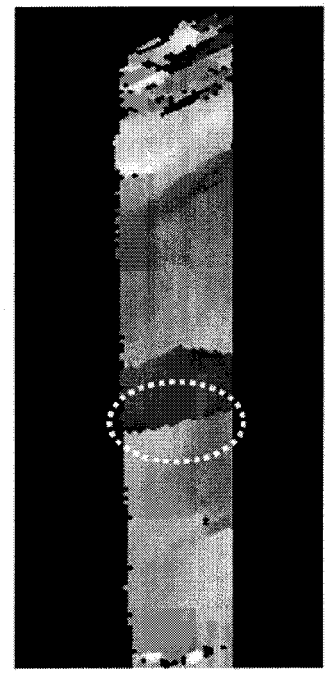
*FIG. 6A* *FIG. 6B*
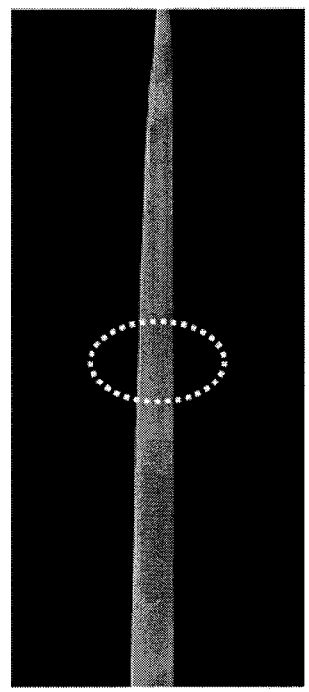 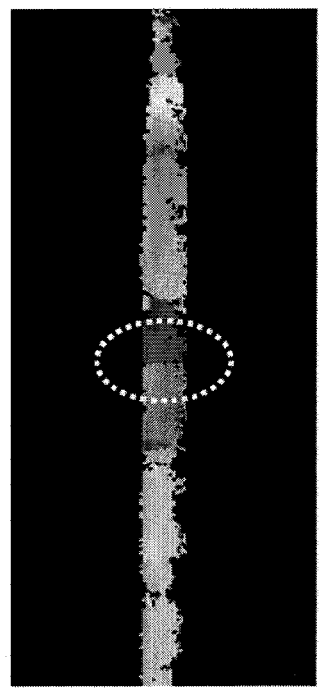

CHARGED PARTICLE BEAM APPARATUS

This application claims priority from Japanese Patent Application No. 2013-181520 filed on Sep. 2, 2013, the entire subject-matter of which is incorporated herein by reference.

BACKGROUND

1. Technical Field

The disclosure relates to a charged particle beam apparatus.

2. Description of the Related Art

An atom probe analysis method is an analysis method in which ions are field-evaporated from a surface of a sample such as a metal or a semiconductor, and the ions are identified by measuring time until the ions are incident on a predetermined mass spectrometer and a voltage at the time of the incidence. In the atom probe analysis method, individual atoms of the sample surface can be directly observed, and atom layers of the sample surface are observed for each layer so that a composition thereof can be identified.

Meanwhile, in analysis according to the atom probe analysis method, it is necessary to manufacture a needle-shaped sample in which a diameter of a tip end is about 100 nm. For this reason, a needle-shaped sample has been measured according to various methods in the related art. In recent years, a technique is known in which a needle-shaped sample is created from a thin film by using a focused ion beam (FIB) (for example, refer to JP-A-2009-294235).

In addition, in recent years, a technique is known in which a sample is irradiated with focused ion beams and electron beams in a perpendicular manner, and secondary charged particles generated by irradiation with the electron beams are detected while processing the sample into a needle shape with the focused ion beams, so that the sample can be processed into a needle shape while observing the sample in real time.

SUMMARY

In the above-described related art, if a tip end of a needle-shaped sample is sharpened, a sample surface may be contaminated by irradiation with the electron beams, or an incidence angle of the electron beams with respect to the sample may vary due to a shape variation caused by the sharpening processing. Therefore, there may be a problem in that contrast is reduced, and thus it may be difficult to acquire a detection result. For this reason, it may not be easy to process a sample into a needle shape while observing the sample in real time.

Therefore, illustrative aspects of the present invention provide a charged particle beam apparatus in which a sample can be easily processed into a needle shape while observing the sample in real time.

According to one illustrative aspect of the present invention, there may be provided a charged particle beam apparatus for processing a tip end portion of a sample into a needle shape, the charged particle beam apparatus comprising: an ion beam irradiation unit configured to irradiate the tip end portion with ion beams; an electron beam irradiation unit configured to irradiate the tip end portion with electron beams; a secondary electron detection unit configured to detect secondary electrons generated at the tip end portion by the irradiation with the electron beams; and an EBSD (Electron BackScatter Diffraction) detection unit configured to detect diffracted electrons generated at the tip end portion by the irradiation with the electron beams.

According to the illustrative aspect of the present invention, even in a case where it is difficult for the secondary electron detection unit to acquire a detection result since, according to the sharpening of the tip end portion, a sample surface is contaminated due to irradiation with the electron beams, or an incidence angle of electron beams to the sample varies due to a shape variation of a sample surface caused by the sharpening processing, the EBSD detection unit can detect diffracted electrons generated at the tip end portion by the irradiation with the electron beams. The EBSD detection unit can measure a crystal orientation of a sample by using electron beams with a high acceleration voltage, and thus allows a sample surface to be less contaminated than in a case of electron beams with a low acceleration voltage and is less influenced by a shape variation of the sample surface. Therefore, an observation image of the sample can be obtained by using a detection result in the EBSD detection unit. In addition, measurement by the EBSD detection unit and sharpening processing by the ion beam irradiation unit are alternately performed, and thus the sample can be processed while checking the processing states (a target position, shape, or the like) of a tip end portion of the sample. Therefore, it is possible to easily process the sample into a needle shape while observing the sample in real time.

In the charged particle beam apparatus, the ion beam irradiation unit and the electron beam irradiation unit may be disposed such that the ion beams and the electron beams are perpendicular to each other.

According to the illustrative aspect of the present invention, this configuration is suitable for usage in which observation is necessary during processing, since the electron beams can be vertically applied to a processed part of the sample using the ion beam irradiation unit.

In the charged particle beam apparatus, the EBSD detection unit may have a detection surface for detecting the diffracted electrons, the detection surface being directed toward the tip end portion, and the detection surface may be disposed in a direction perpendicular to both of the ion beams and the electron beams when viewed from the tip end portion.

According to the illustrative aspect of the present invention, since the detection surface of the EBSD detection unit is directed toward the tip end portion and is disposed in a direction perpendicular to both ion beams and electron beams when viewed from the tip end portion, it is possible to efficiently detect the diffracted electrons from the sharpened sample.

The charged particle beam apparatus may further comprise an EDS detection unit configured to detect X rays generated at the tip end portion.

According to the illustrative aspect of the present invention, a detection result from the EDS detection unit is used, and thus it is possible to monitor a processing state when interfaces having different compositions in the sample are processing targets.

The charged particle beam apparatus may further comprise a STEM detection unit configured to detect transmitted electrons which are transmitted through the tip end portion.

According to the illustrative aspect of the present invention, the transmitted electrons which are transmitted through the sample are detected by the STEM detection unit, and thus it is possible to obtain information on both a crystal and a composition. Thus, it is possible to monitor a processing state when the sample is processed into a needle shape.

In the charged particle beam apparatus, the sample may be used for atom probe analysis.

According to the illustrative aspect of the present invention, since a sample is easily processed into a needle shape while the sample is observed in real time, a needle-shaped sample having a diameter of a tip end of about 100 nm, used for atom probe analysis, can also be easily manufactured.

The charged particle beam apparatus may further comprise a sample holding unit configured to fix a position of the sample such that the tip end portion is disposed at an intersection between the ion beams and the electron beams.

According to the illustrative aspect of the present invention, since the tip end portion is disposed at an intersection between the ion beams and electron beams, it is possible to easily and accurately apply the electron beams to a processed part of the sample. This is a configuration suitable for usage in which observation is necessary during processing.

The charged particle beam apparatus may further comprise a display unit configured to display at least a detection result from the secondary electron detection unit and a detection result from the EBSD detection unit.

According to the illustrative aspect of the present invention, since the display unit can display a detection result from the secondary electron detection unit and a detection result from the EBSD detection unit, it is possible to easily process the sample into a needle shape while observing the sample in real time.

According to the illustrative aspects of the present invention, since the measurement by the EBSD detection unit and the sharpening processing by the ion beam irradiation unit are alternately performed, and thus the sample can be processed while checking a processing target position of the tip end portion of the sample, it is possible to process the sample into a needle shape while observing the sample in real time.

BRIEF DESCRIPTION OF THE DRAWINGS

FIG. 5A is a diagram illustrating an observation image using a detection result from a secondary electron detection unit 24, and FIG. 5B is a diagram illustrating an observation image using a detection result from an EBSD detection unit 40.

FIG. 6A is a diagram illustrating an observation image using a detection result from the secondary electron detection unit 24, and FIG. 6B is a diagram illustrating an observation image using a detection result from the EBSD detection unit 40.

DETAILED DESCRIPTION

Hereinafter, an illustrative embodiment of the present invention will be described.

Figure 1:
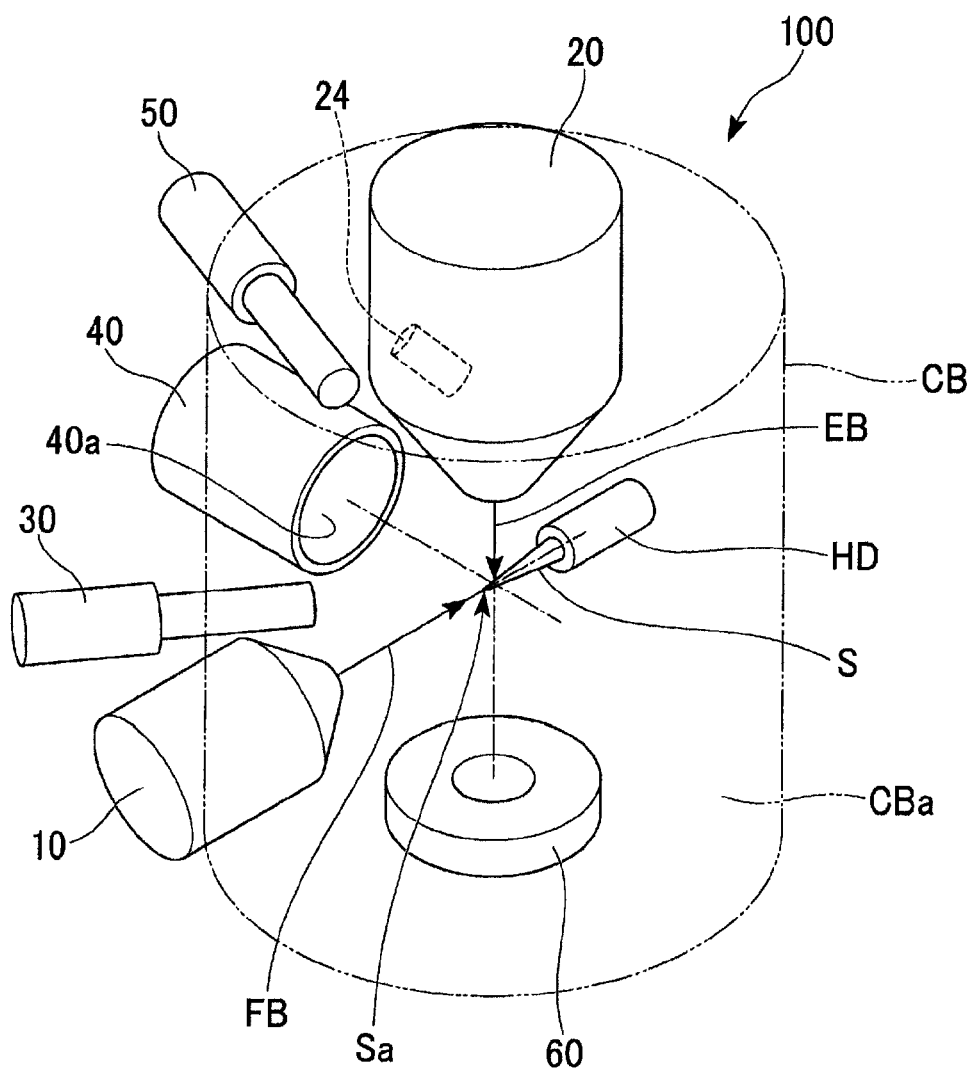
FIG. 1 is a schematic diagram illustrating a configuration of a charged particle beam apparatus 100 according to an illustrative embodiment.

FIG. 1 is a schematic diagram illustrating a configuration of a charged particle beam apparatus 100 according to the present illustrative embodiment.

The charged particle beam apparatus 100 illustrated in FIG. 1 manufactures a needle-shaped sample S used for an atom probe analysis method. As a material forming the sample S, for example, a metal or a semiconductor is used. The sample S is sharpened by the charged particle beam apparatus 100 so that a diameter of a tip end portion Sa is about 100 nm.

As illustrated in FIG. 1, the charged particle beam apparatus 100 includes an ion beam irradiation unit 10 which applies focused ion beams FB, an electron beam irradiation unit 20 which applies electron beams EB, a secondary electron detection unit 30, an EBSD detection unit 40, an EDS detection unit 50, a STEM detection unit 60, a sample holding unit HD which holds the sample S, a vacuum chamber CB, a control unit CR, and a display unit DP.

In the charged particle beam apparatus 100, some or all of the ion beam irradiation unit 10, the electron beam irradiation unit 20, the secondary electron detection unit 30, the EBSD detection unit 40, the EDS detection unit 50, the STEM detection unit 60, and the sample holding unit HD are disposed inside the vacuum chamber CB. A vacuum pump (not illustrated) is provided in the vacuum chamber CB, and thus the inside CBa thereof can be exhausted up to a high vacuum atmosphere.

Figure 2:
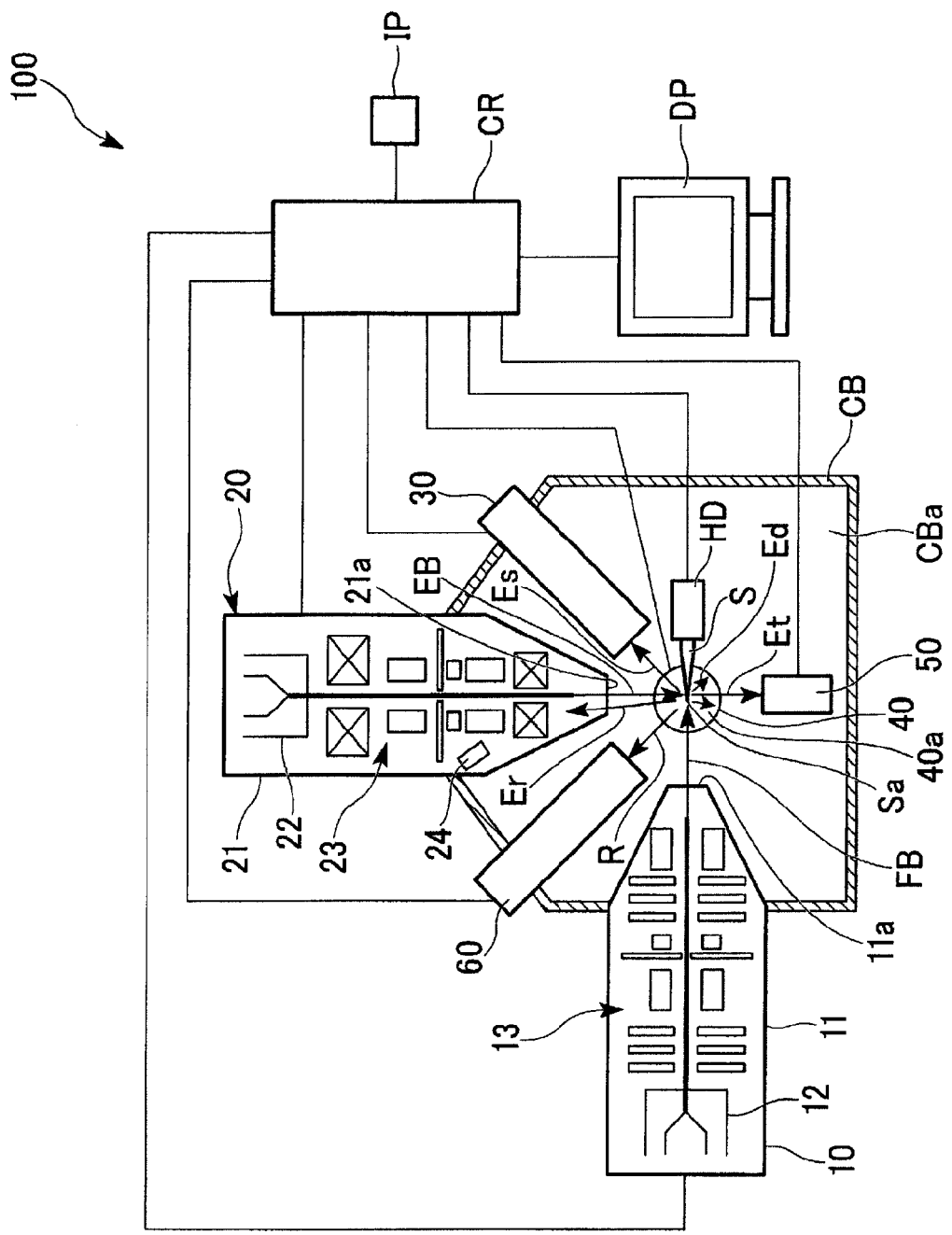
FIG. 2 is a schematic cross-sectional view of the charged particle beam apparatus 100.

FIG. 2 is a schematic cross-sectional view of the charged particle beam apparatus 100. FIG. 2 illustrates only cross-sectional configurations of the ion beam irradiation unit 10, the electron beam irradiation unit 20, and the vacuum chamber CB, and schematically illustrates the other configurations. In addition, in FIG. 2, directions in the figure are described by using an XYZ coordinate system. In the XYZ coordinate system, an irradiation direction of the focused ion beams FB which are applied from the ion beam irradiation unit 10 is set to an X direction, an irradiation direction of the electron beams EB which are applied from the electron beam irradiation unit 20 is set to a Y direction, and a direction perpendicular to the X direction and the Y direction is set to a Z direction. It will be described that, in each of the X direction, the Y direction, and the Z direction, the arrow direction in the figure is a positive direction, and a direction opposite to the arrow direction is a negative direction. In addition, a direction around the X axis is indicated by a θX direction.

As illustrated in FIG. 2, the ion beam irradiation unit 10 includes an ion beam column 11, an ion beam generation source 12, and an ion beam optical system 13. The ion beam column 11 is formed in a cylindrical shape, and a central axis thereof is disposed in parallel to the X direction. The ion beam generation source 12 and the ion beam optical system 13 are disposed inside the ion beam column 11. The ion beam irradiation unit 10 has a configuration in which ion beams generated by the ion beam generation source 12 are thinned by the ion beam optical system 13 so as to be formed as focused ion beams FB, and the focused ion beams FB are emitted in the +X direction from an emission port 11a which is disposed at an +X side end part of the ion beam column 11.

The electron beam irradiation unit 20 includes an electron beam column 21, an electron beam generation source 22, and an electron beam optical system 23. The electron beam column 21 is formed in a cylindrical shape, and a central axis thereof is disposed in parallel to the Y direction. The electron beam generation source 22 and the electron beam optical system 23 are disposed inside the electron beam column 21. The electron beam irradiation unit 20 has a configuration in which electron beams generated by the electron beam generation source 22 are thinned by the electron beam optical system 23 so as to be formed as electron beams EB, and the electron beams EB are emitted in the +Y direction from an emission port 21a which is disposed at a +Y side end part of the electron beam column 21. As mentioned above, an irradiation axis of the electron beams EB applied by the electron beam irradiation unit 20 is parallel to the Y axis. In addition, a secondary electron detection unit 24 detecting reflected electrons Er which are generated at the tip end portion Sa of the sample S and reach the inside of the electron beam column 21 is provided inside the electron beam column 21.

As mentioned above, the ion beam irradiation unit 10 and the electron beam irradiation unit 20 are disposed so that the focused ion beams FB and electron beams EB are applied in directions perpendicular to each other. The sample holding unit HD holds the sample S so that the tip end portion Sa of the sample S is disposed at a position where the focused ion beams FB intersect the electron beams EB or near the position.

In the present illustrative embodiment, the sample holding unit HD holds the sample S so that the sample S is not moved. The sample holding unit HD holds the sample S so that the tip end portion Sa of the sample S faces in the −X direction. For this reason, the focused ion beams FB are applied to the tip end portion Sa from the tip end side of the sample S. In addition, since the electron beams EB are applied in the direction perpendicular to the focused ion beams FB, the electron beams EB can be applied to the tip end portion Sa which is irradiated with the focused ion beams FB. For this reason, it is possible to observe the tip end portion Sa which is currently being processed by the focused ion beams FB.

The ion beam irradiation unit 10 can change an irradiation position of the focused ion beams FB with respect to the tip end portion Sa of the sample S.

When the tip end portion Sa of the sample S is irradiated with the electron beams EB, charged particles such as secondary electrons Es or diffracted electrons Ed are generated at the tip end portion Sa. In addition, X rays R are emitted from the tip end portion Sa. Further, transmitted electrons Et which are transmitted through the tip end portion Sa are also generated. When the focused ion beams FB are applied, secondary electrons, secondary ions, or the like are generated at the tip end portion Sa.

The secondary electron detection unit 30 detects the secondary electrons Es generated at the tip end portion Sa of the sample S. The secondary electron detection unit 30 detects electrons which have angles different from those of electrons detected by the secondary electron detection unit 24, among the secondary electrons Es. An uneven shape or the like of the tip end portion Sa can be observed by using a result detected by the secondary electron detection unit 30.

The EBSD detection unit 40 detects the diffracted electrons Ed generated at the tip end portion Sa of the sample S. The EBSD detection unit 40 performs detection based on a principle of an electron beam backscatter diffraction method. The electron beam backscatter diffraction method is a method of analyzing a diffraction pattern of the diffracted electrons generated by irradiation with the electron beams EB. If a crystalline sample is irradiated with electron beams, the diffracted electrons are generated as described above. The diffracted electrons are diffracted by crystal lattice surfaces of the sample. The diffracted electrons form a strip-shaped diffraction pattern on a predetermined surface. A crystal structure or a crystal orientation can be obtained by detecting the diffraction pattern.

The EBSD detection unit 40 has a detection surface 40a on which a diffraction pattern is formed. The EBSD detection unit 40 can detect a diffraction pattern of diffracted electrons, formed on the detection surface 40a. The detection surface 40a has a planar shape, and faces in the −Z side direction. The detection surface 40a is circular when viewed in the Z direction. The detection surface 40a is disposed in the +Z direction when viewed from the tip end portion Sa of the sample S.

Figure 3A:
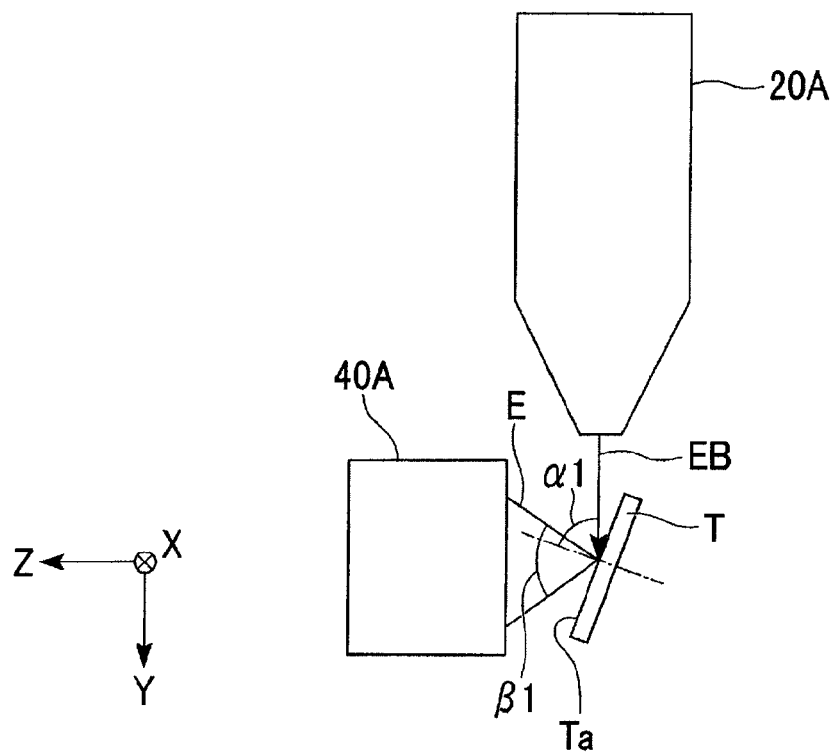
FIG. 3A is a diagram illustrating a principle of an electron beam backscatter diffraction method.

FIG. 3A is a diagram illustrating a principle of an electron beam backscatter diffraction method.

As illustrated in FIG. 3A, in the electron beam backscatter diffraction method, an electron beam irradiation unit 20A irradiates a measurement surface Ta of a sample T having the predetermined measurement surface Ta with electron beams EB with an incidence angle of α1 (about 70°). In this case, diffracted electrons E which are diffracted at crystal lattice surfaces of the sample T are radiated with a predetermined angle β1 (about 70°). An EBSD detection unit 40A detects a diffraction pattern of the diffracted electrons E which are diffracted at this time.

Figure 3B:
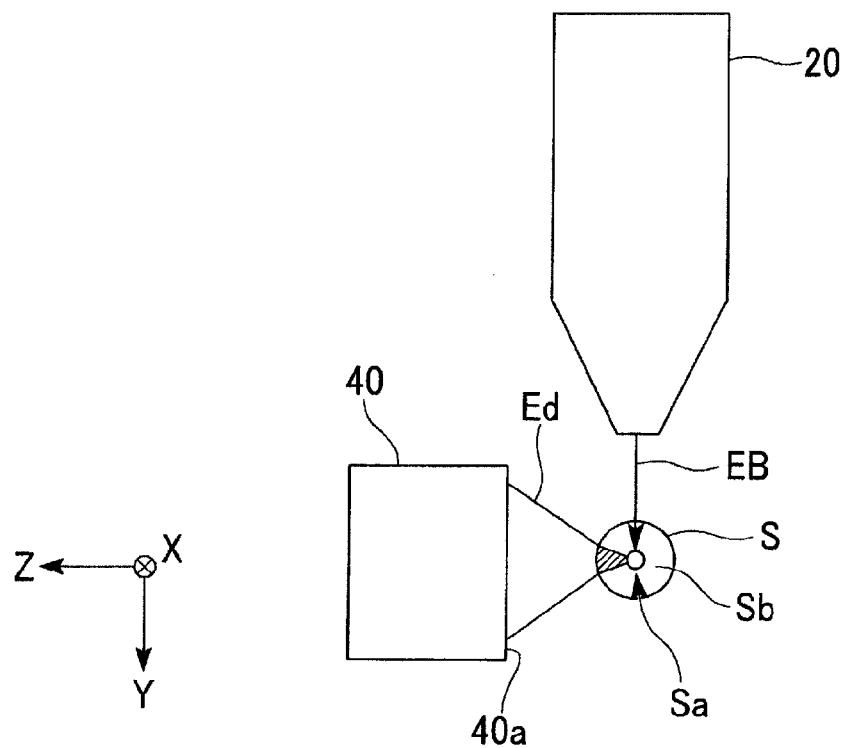
FIG. 3B is a diagram illustrating a state in which an EBSD detection unit 40 detects diffracted electrons Ed which are generated when a tip end portion Sa of a sample S is irradiated with electron beams EB in the illustrative embodiment.

FIG. 3B is a diagram illustrating a state in which the EBSD detection unit 40 detects diffracted electrons Ed generated when the tip end portion Sa of the sample S is irradiated with the electron beams EB in the present illustrative embodiment. As illustrated in FIG. 3B, the tip end portion Sa of the sample S is processed into a needle shape and is thus formed to have a taper Sb.

The electron beams EB are applied to the tip end portion Sa when viewed in the X direction. The diffracted electrons Ed are generated at the tip end portion Sa by the irradiation with the electron beams EB. The EBSD detection unit 40 detects a diffraction pattern of the diffracted electrons Ed which travel in a direction of a predetermined angular range (about 70°) toward the +Z side from the tip end portion Sa.

The EDS detection unit 50 detects the X rays R generated at the tip end portion Sa of the sample S. The X rays R are characteristic X rays which are different for each element. The EDS detection unit 50 can detect such characteristic X rays and thus can detect an element contained in the tip end portion Sa. In addition, the EDS detection unit 50 has low dependency on an orientation of a detection result, and thus the detection surface may face toward the sample S side. By using the EDS detection unit 50, a processing state can be observed when interfaces having different compositions are processed in the tip end portion Sa.

The STEM detection unit 60 detects the transmitted electrons Et which are transmitted through the tip end portion Sa of the sample S. The STEM detection unit 60 can detect a crystal state, composition information, or the like of the tip end portion Sa. In addition, the control unit CR can obtain three-dimensional information of the tip end portion Sa on the basis of a detection result from the STEM detection unit 60. In a stage in which the tip end portion Sa is not sufficiently processed, since a diameter of the tip end portion Sa is large, the transmitted electrons Et are few, and detection accuracy is not high. On the other hand, if processing of the tip end portion Sa progresses, since a diameter of the tip end portion Sa is reduced (about 100 nm), transmitted electrons Et increase, and thus detection accuracy increases. Therefore, the present illustrative embodiment is suitably used (for example, in a final step) after the step of the tip end portion Sa being currently processed.

The control unit CR collectively controls the above-described constituent elements, and changes an acceleration voltage or a beam current of the ion beam column 11 of the ion beam irradiation unit 10 and the electron beam column 21 of the electron beam irradiation unit 20. The control unit CR changes an acceleration voltage or a beam amount of the ion beam irradiation unit 10 so that a beam diameter of the focused ion beams FB can be freely adjusted. Thus, an observation image can not only be acquired, but the sample S can also be locally etched. In addition, when etching processing is performed, a beam diameter is adjusted, and thus processing accuracy can be freely varied from rough processing to finish processing.

The control unit CR can generate observation image data by converting detection results detected by the respective units including the secondary electron detection unit 24, the secondary electron detection unit 30, the EBSD detection unit 40, the EDS detection unit 50, and the STEM detection unit 60, into signals. The control unit CR generates the observation image data, and then can output an observation image to the display unit DP on the basis of the observation image data.

The control unit CR is connected to an input unit IP which allows an operator to input. The control unit CR can control each constituent element on the basis of a signal which is input via the input unit IP. For example, the operator can adjust irradiation positions or beam diameters of the focused ion beams FB and electron beams EB via the input unit IP. In this case, the operator can perform etching processing by irradiating a desired region of the tip end portion Sa with the focused ion beams FB, or can perform observation by irradiating the desired region with the electron beams EB.

Next, a description will be made of a sample creation method of processing the sample S into a needle shape by using the charged particle beam apparatus 100 having this configuration. First, an initial setting is performed in which the sample S is held on the sample holding unit HD and the vacuum chamber CB is set to a vacuum state. After the initial setting is completed, steps are performed in which the sample S is irradiated with the focused ion beams FB so as to process the tip end portion Sa of the sample S into a needle shape.

The control unit CR operates the sample holding unit HD so as to adjust a position of the tip end portion Sa of the sample S. Then, the control unit CR causes the ion beam irradiation unit 10 to irradiate the sample S with the focused ion beams FB.

Figure 4:
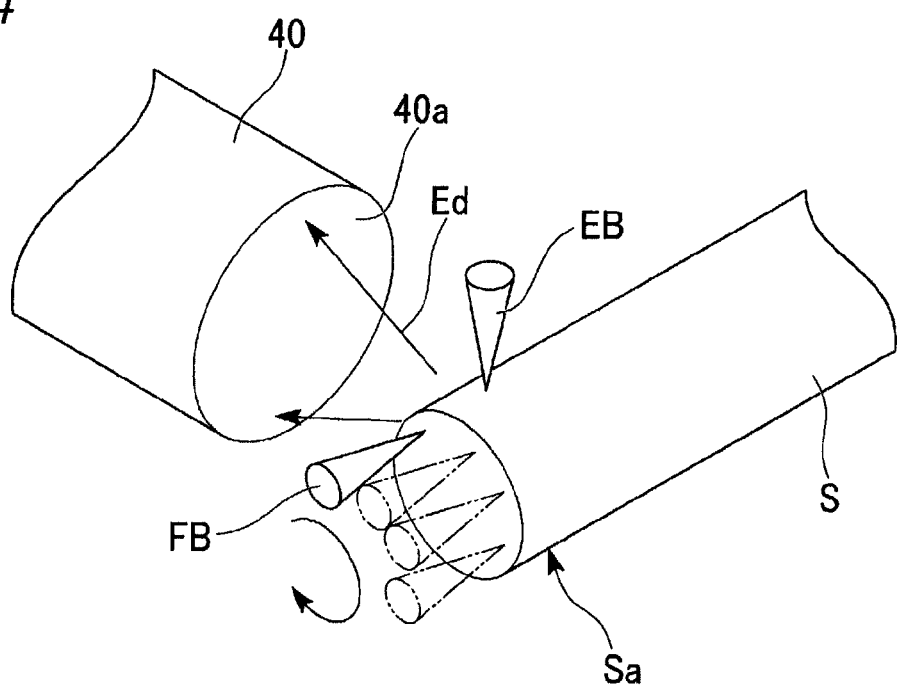
FIG. 4 is a diagram illustrating a state in which the tip end portion Sa is processed by an ion beam irradiation unit 10.

FIG. 4 is a diagram illustrating a state in which the tip end portion Sa is processed by the ion beam irradiation unit 10.

As illustrated in FIG. 4, the ion beam irradiation unit 10 irradiates the tip end portion Sa with the focused ion beams FB in the +X direction. At this time, the focused ion beams FB are applied to a position deviated a central part of the tip end portion Sa when viewed from the X direction. A part of the tip end portion Sa which is irradiated with the focused ion beams FB is selectively etched by the focused ion beams FB.

After the part of the tip end portion Sa is irradiated with the focused ion beams FB, the control unit CR deviates an irradiation position of the focused ion beams FB in the θX direction so as to apply the focused ion beams FB thereto. As mentioned above, the etching is performed while deviating an irradiation region of the focused ion beams FB in the θX direction. This process is repeatedly performed, and thus the tip end portion Sa of the sample S is gradually sharpened so as to be formed into a needle shape.

A rotation angle of the sample S, or a beam diameter, an irradiation time, or the like of the focused ion beams FB may be set by the operator, and may be set to a predetermined value in advance and the predetermined value may be used. In a case where the predetermined value is set, the predetermined value may be changed.

During processing of the sample S, in a case where it is desired to check an observation image, the electron beam irradiation unit 20 may be made to apply the electron beams EB as appropriate. FIG. 4 illustrates a state in which the diffracted electrons Ed which are generated by the irradiation with the electron beams EB are detected at a detection surface 40*a* of the EBSD detection unit 40. The present invention is not limited thereto, and secondary electrons Es, reflected electrons Er, transmitted electrons Et, X rays R, and the like generated by irradiation with the electron beams EB may be detected by the various detection units (the secondary electron detection unit 24, the secondary electron detection unit 30, the EBSD detection unit 50, and the STEM detection unit 60).

The control unit CR generates observation image data based on detection results from the respective detection units, and displays an observation image on the display unit DP. The operator can observe a state of the tip end portion Sa of the sample S from the observation image displayed on the display unit DP. The operator can select an observation image of a detection unit which is displayed on the display unit DP.

In FIGS. 5A to 8B, FIGS. 5A, 6A, 7A and 8A are diagrams illustrating observation images using detection results from the secondary electron detection unit 24, and FIGS. 5B, 6B, 7B and 8B are diagrams illustrating observation images using detection results from the EBSD detection unit 40. In FIGS. 5A to 8B, when a steel material is used as the sample S, a grain boundary for a predetermined region (a region surrounded by a dashed elliptical circle in each figure) of the tip end portion Sa is illustrated.

In a case where processing using the focused ion beams FB is in an initial stage, for example, as illustrated in FIGS. 5A and 5B, a grain boundary for the predetermined region of the tip end portion Sa can be observed from both an observation image obtained by using the secondary electron detection unit 24 and an observation image obtained by using the EBSD detection unit 40. Even in a state in which the processing progresses to some degree, as illustrated in FIGS. 6A and 6B, a grain boundary for the predetermined region can be observed from both an observation image obtained by using the secondary electron detection unit 24 and an observation image obtained by using the EBSD detection unit 40.

Figure 7A:
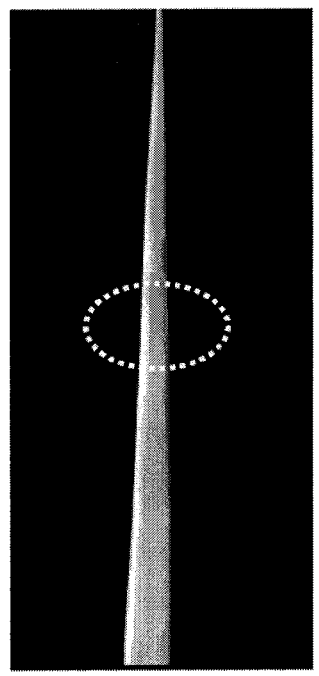
FIG. 7A is a diagram illustrating an observation image using a detection result from the secondary electron detection unit 24.

On the other hand, if the processing for the tip end portion Sa of the sample S progresses, and thus the needle-shaped tip end portion Sa is sharpened, it is difficult to acquire an observation image since image contrast of the secondary electron detection unit 24, the secondary electron detection unit 30, or the like is reduced since contamination occurs due to a surface sample being irradiated with the electron beams, or an incidence angle of the electron beams varies due to a surface shape variation caused by the sharpening. For example, as illustrated in FIG. 7A, a grain boundary for the predetermined region cannot be observed from an observation image obtained by using the secondary electron detection unit 24. Also in a state of FIG. 8A in which the processing further progresses from the state illustrated in FIG. 7A, a grain boundary for the predetermined region cannot be observed from an observation image obtained by using the secondary electron detection unit 24. As mentioned above, in a stage in which the processing progresses and the tip end portion Sa is sharpened, using only the secondary electron detection system makes it difficult to process the sample into a needle shape while the sample is observed in real time.

Figure 7B:
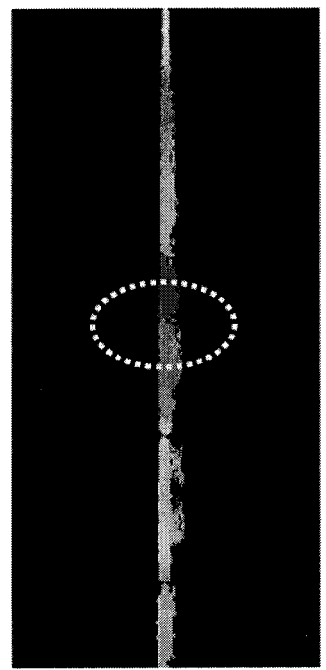
FIG. 7B is a diagram illustrating an observation image using a detection result from the EBSD detection unit 40.
Figure 8A:
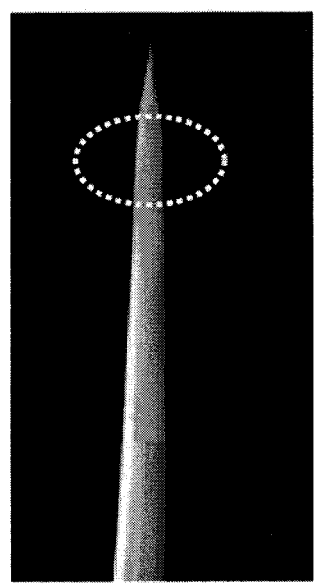
FIG. 8A is a diagram illustrating an observation image using a detection result from the secondary electron detection unit 24.
Figure 8B:
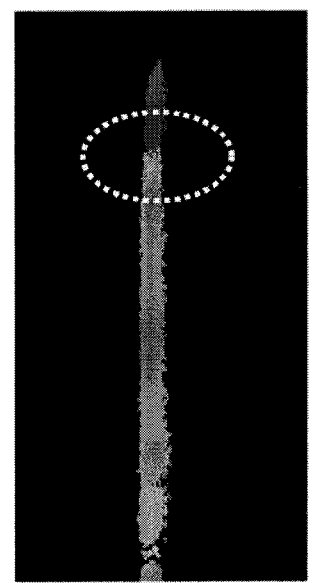
FIG. 8B is a diagram illustrating an observation image using a detection result from the EBSD detection unit 40.

In contrast, in the present illustrative embodiment, even in a case where it is difficult to acquire an observation image from a detection result in the secondary electron detection system in relation to the sharpened tip end portion Sa, the EBSD detection unit 40 can detect diffracted electrons Ed generated at the tip end portion Sa by irradiation with the electron beams EB. The EBSD detection unit 40 can measure a crystal orientation of a sample by using electron beams with a high acceleration voltage of, for example, 30 kV or more, and are thus less influenced by contamination of a sample surface or a surface shape variation. Therefore, an observation image of the tip end portion Sa can be obtained by using a detection result in the EBSD detection unit 40. For example, as illustrated in FIGS. 7B and 8B, a grain boundary for the predetermined region is clearly displayed in a result detected by the EBSD detection unit 40.

For this reason, the measurement by the EBSD detection unit 40 and the processing of the tip end portion Sa by the ion beam irradiation unit 10 are alternately performed, and thus the sample can be processed while checking the processing states (a target position, shape, or the like) of the tip end portion Sa. In addition, observation of the sample S and processing into a needle shape are not alternately performed but are easily simultaneously performed.

Here, a description will be made of the manufacturing of a sharpened needle-shaped sample having a desired grain boundary.

The sample is rotated and is irradiated with the focused ion beams, so that the tip end portion is gradually sharpened. The tip end portion becomes smaller due to the sharpening, and thus there is a probability that a desired grain boundary may also be processed with etching by the irradiation with the focused ion beams. Therefore, the desired grain boundary is measured through EBSD measurement, and processing is continuously performed so that the grain boundary remains in the sample. At this time, the grain boundary can be observed even if the sample is rotated, and thus an observation target is not lost. Consequently, it is possible to accurately manufacture a sharpened needle-like sample including the desired observation target.

The ion beam irradiation unit 10 and the electron beam irradiation unit 20 are disposed so that the focused ion beams FB and the electron beams EB are perpendicular to each other. This is a configuration suitable for usage in which observation is necessary during processing, since the electron beams EB can be vertically applied to a processed part of the sample S using the ion beam irradiation unit 10.

The EBSD detection unit 40 has the detection surface 40*a* which is directed toward the tip end portion Sa and is used to detect the diffracted electrons Ed, and the detection surface 40*a* is disposed in a direction perpendicular to both of the focused ion beams FB and the electron beams EB when viewed from the tip end portion Sa. For this reason, it is possible to efficiently detect the diffracted electrons Ed from the tip end portion Sa.

The X rays R generated at the tip end portion Sa are detected by the EDS detection unit 50, and a detection result is used, and thus it is possible to monitor a processing state when interfaces having different compositions in the sample S are processing targets.

The transmitted electrons Et which are transmitted through the tip end portion Sa are detected by the STEM detection unit 60, and a detection result is used, and thus it is possible to obtain information on both a crystal and a composition. Thus, it is possible to monitor a processing state when the sample S is processed into a needle shape.

In the present illustrative embodiment, since a sample S is easily processed into a needle shape while the sample is observed in real time, a needle-shaped sample having a diameter of a tip end of about 100 nm, used for atom probe analysis, can also be easily manufactured.

Since a position of the sample S is fixed by the sample holding unit HD so that the tip end portion Sa is disposed at an intersection between the focused ion beams FB and the electron beams EB, it is possible to easily and accurately apply the electron beams EB to a processed part of the sample S. This is a configuration suitable for usage in which observation is necessary during processing.

Since the display unit DP can display detection results from the secondary electron detection units 24 and 30 and a detection result from the EBSD detection unit 40, it is possible to easily process the sample S into a needle shape while observing the sample S in real time.

The technical scope of the present invention is not limited to the above-described illustrative embodiment, and may be modified within the scope without departing from the spirit of the present invention as appropriate.

For example, in the above-described illustrative embodiment, a case where a grain boundary of the tip end portion Sa of the sample S made of a steel material is observed has been described as an example, but the present invention is not limited thereto. For example, when the sample S made of a semiconductor is used, a distribution of impurities may be observed.

What is claimed is:

1. A charged particle beam apparatus for processing a tip end portion of a sample into a needle shape, the charged particle beam apparatus comprising:
   an ion beam irradiation unit configured to irradiate the tip end portion with ion beams;
   an electron beam irradiation unit configured to irradiate the tip end portion with electron beams;
   a secondary electron detection unit configured to detect secondary electrons generated at the tip end portion by the irradiation with the electron beams; and
   an EBSD detection unit configured to detect backscattered diffracted electrons generated at the tip end portion by the irradiation with the electron beams.

2. The charged particle beam apparatus according to claim 1, wherein the ion beam irradiation unit and the electron beam irradiation unit are disposed such that the ion beams and the electron beams are perpendicular to each other.

3. The charged particle beam apparatus according to claim 2,
   wherein the EBSD detection unit has a detection surface for detecting the diffracted electrons, the detection surface being directed toward the tip end portion, and
   wherein the detection surface is disposed in a direction perpendicular to both of the ion beams and the electron beams when viewed from the tip end portion.

4. The charged particle beam apparatus according to claim 1, further comprising:
   an EDS detection unit configured to detect X rays generated at the tip end portion.

5. The charged particle beam apparatus according to claim 1, further comprising:
   a STEM detection unit disposed along an irradiation direction of the electron beams and configured to detect transmitted electrons which are transmitted through the tip end portion.

6. The charged particle beam apparatus according to claim 1, wherein the sample is used for atom probe analysis.

7. The charged particle beam apparatus according to claim 1, further comprising:
   a sample holding unit configured to fix a position of the sample such that the tip end portion is disposed at an intersection between the ion beams and the electron beams.

8. The charged particle beam apparatus according to claim 1, further comprising:

a display unit configured to display at least a detection result from the secondary electron detection unit and a detection result from the EBSD detection unit.

9. The charged particle beam apparatus according to claim 1,
   wherein the EBSD detection unit has a detection surface for detecting the diffracted electrons, the detection surface being directed toward the tip end portion, and
   wherein the detection surface is disposed to detect diffracted electrons traveling in a direction perpendicular to an irradiation direction of the electron beams.

* * * * *